United States Patent [19]

Freeouf et al.

[11] Patent Number: 4,518,846

[45] Date of Patent: May 21, 1985

[54] HEATER ASSEMBLY FOR MOLECULAR BEAM EPITAXY FURNACE

[75] Inventors: John L. Freeouf; Thomas N. Jackson, both of Peekskill, N.Y.

[73] Assignee: International Business Machines Corp., Armonk, N.Y.

[21] Appl. No.: 619,106

[22] Filed: Jun. 11, 1984

[51] Int. Cl.³ .............................................. C23C 13/12
[52] U.S. Cl. .................................... 219/271; 219/275; 373/110; 118/726; 156/DIG. 103
[58] Field of Search ................ 219/271, 275; 373/110, 373/111, 112, 11; 118/726, 727, 733; 156/DIG. 103, 611, 613

[56] References Cited

U.S. PATENT DOCUMENTS

| | | | |
|---|---|---|---|
| 3,641,973 | 2/1972 | Schrader | 118/725 X |
| 3,656,454 | 4/1972 | Schrader | 118/725 X |
| 3,734,056 | 5/1973 | King | 118/726 |
| 3,839,084 | 10/1974 | Cho et al. | 156/611 |
| 3,916,034 | 10/1975 | Tsuchimoto | 427/38 |
| 4,016,800 | 12/1977 | Anderson | 219/275 X |
| 4,094,269 | 6/1978 | Malinouski et al. | 118/726 |
| 4,137,865 | 2/1979 | Cho | 204/298 X |
| 4,181,544 | 1/1980 | Cho | 148/175 |
| 4,286,545 | 9/1981 | Takagi et al. | 118/723 |
| 4,392,453 | 7/1983 | Luscher | 118/726 |
| 4,426,237 | 1/1984 | Freeouf et al. | 118/726 X |
| 4,426,569 | 1/1984 | Miller et al. | 219/275 X |
| 4,447,276 | 5/1984 | Davies et al. | 156/611 X |

FOREIGN PATENT DOCUMENTS 2066299  1/1981  United Kingdom ..... 156/DIG. 103
2080271  2/1982  United Kingdom ................ 156/611

OTHER PUBLICATIONS

Ueda, "Synthesis and Epitaxial Growth of CdTe Films by Neutral and Ionized Beams", *Journal of Crystal Growth*, vol. 31, pp. 333–338, 1975.
Kubiak et al., "A Simple Source Cell Design for MBE", *J. of Vac. Science and Tech.*, vol. 20, pp. 252–253, 1982.

*Primary Examiner*—John D. Smith
*Assistant Examiner*—Bernard F. Plantz
*Attorney, Agent, or Firm*—Pollock, Vande Sande & Priddy

[57] ABSTRACT

In a molecular beam epitaxy furnace, a heater is described for heating the interior of an effusion cell. The heater includes an outer cylindrical sleeve having one end connected to receive a vacuum, and an opposite end extending into the furnace. An inner sleeve is provided coaxial with the outer cylindrical sleeve, one end of the inner sleeve being sealed with the opposite end of the cylindrical sleeve. The inner sleeve extends along a portion of the outer cylindrical sleeve providing an interior vacuum chamber. A heating element is disposed between the cylindrical sleeve and inner sleeve which heats the interior crucible receiving chamber and a crucible therein bearing semiconductor constituent material such that the semiconductor constituent material effuses without contamination from the heating element.

4 Claims, 2 Drawing Figures

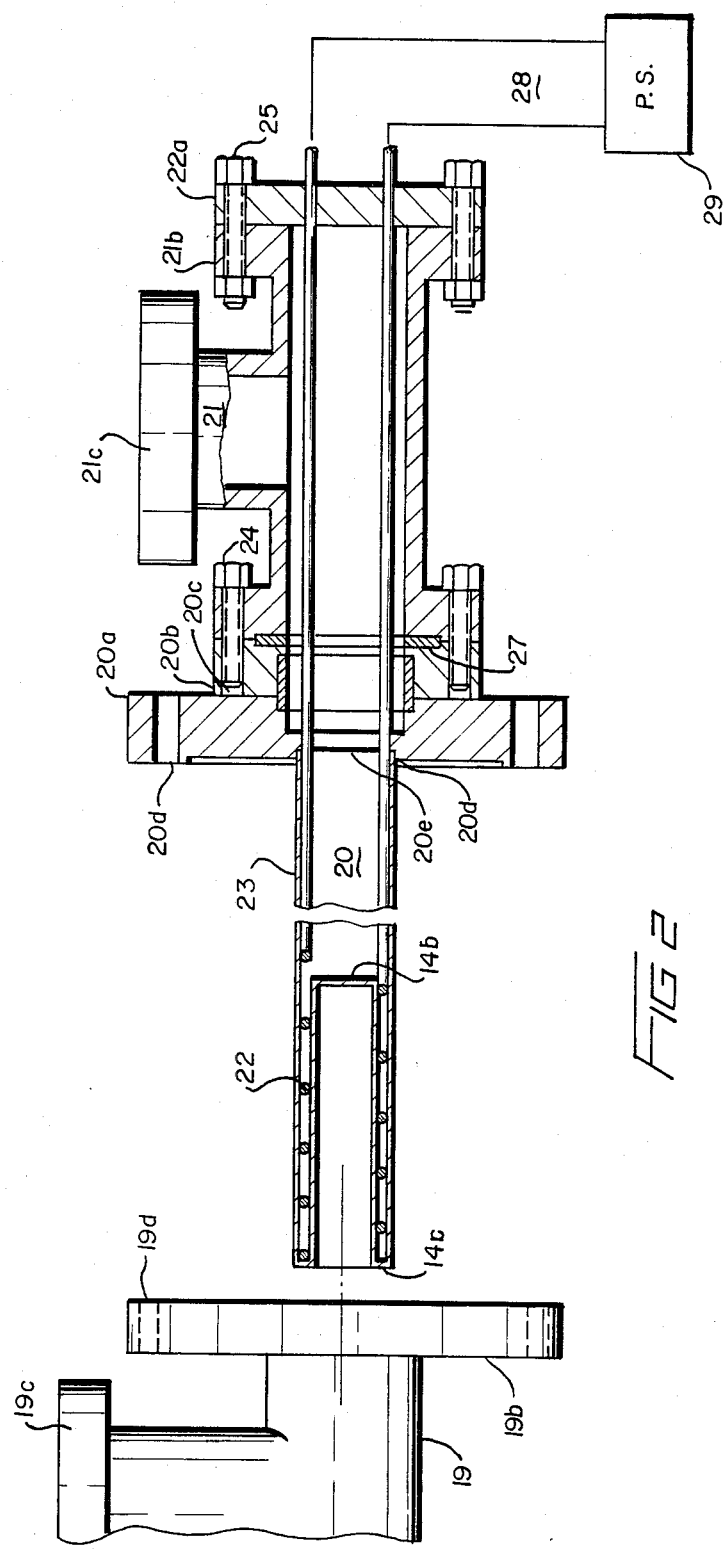

HEATER ASSEMBLY FOR MOLECULAR BEAM EPITAXY FURNACE

BACKGROUND OF THE INVENTION

The present invention relates to apparatus used in the semiconductor manufacturing art for heating an effusion cell having an evolving ingredient in a molecular beam epitaxy furnace. Specifically, a replaceable heating assembly for the effusion cell having a vacuum separate from the main furnace vacuum is provided.

Molecular beam epitaxy techniques have been described which permit growing epitaxial layers of semiconductor crystals. In vacuum epitaxy techniques, thin films of crystalline material are deposited on a substrate by evaporating material in a vacuum system onto the surface of a substrate. Vacuum epitaxy processes are carried out in a high vacuum which contains a heated substrate. Effusion ovens are provided for heating the materials to be deposited. The material effuses atoms of the semiconductor constituent through an orifice in the effusion cell oven. A controlled flux of effused semiconductor constituent material may be generated which is controlled by oven temperature and the size of the oven orifice.

In order to obtain high crystalline and semiconductor quality of the epitaxial layers, the vacuum environment of the substrate must be maintained free of contaminants. In the past, the heating element of the effusion oven has been a source of contaminants. Typically, a heating element consists of a wire or mesh surrounding a crucible containing the source material. Insulators may be present to separate the current carrying elements. Reactions between the insulator and refractory metals of the effusion ovens can result, providing another source of contaminants. Experience has shown that 1 part in $10^7$ or less contamination of the semiconductor atoms will result in observable effects to the resulting crystal structure.

SUMMARY OF THE INVENTION

It is an object of this invention to provide a new heater assembly for a molecular beam epitaxy (MBE) furnace.

It is a more specific object of this invention to provide a heater assembly which avoids the generation of contaminants in an MBE furnace.

These and other objects are accomplished by apparatus in accordance with the invention. A replaceable heater assembly is provided for inserting in an effusion cell of the MBE furnance. The heater assembly includes at one end thereof, an inner crucible housing for supporting a crucible containing material to be effused. A heater element chamber is formed exterior to the inner crucible housing and sealed therefrom. A vacuum may be applied to the heater element chamber distinct from the MBE furnace vacuum. A heater element within the heater element chamber is maintained under the distinct separate vacuum and is isolated from the furnace interior. Electrical current supplied to the heater element heats the heater element chamber and the crucible located in the interior crucible chamber.

In a preferred embodiment of the invention, a heater assembly comprises a longitudinal cylindrical housing terminated at one end by a flange. When inserted in an effusion cell, the flange couples to a coupling flange of the effusion cell external to the MBE furnace. The remaining end of the cylindrical housing extends within the MBE furnace.

The remaining end of said cylindrical housing contains an interior crucible housing for supporting a crucible bearing the material to be effused onto the substrate. One end of the interior crucible housing is coextensive with said cylindrical housing remaining end and is sealed therewith. The remaining end of said crucible housing is closed off by a wall member. The crucible housing and cylindrical housing define a heater element compartment sealed from the furnace.

The heater assembly of the preferred embodiment may be introduced into the effusion cell of an MBE furnace through a vacuum isolation valve. A bellows unit is connected to the isolation valve. A first coupling is connected to the bellows unit which includes a vacuum port for supplying a vacuum to the effusion cell and furnace. The heater assembly flange member is fastened to a corresponding flange on the first coupling.

With the preferred embodiment, it is possible to apply a second vacuum to the heater assembly through a second vacuum port in the flange member. The heater assembly is thus maintained at a second vacuum isolated from the MBE furnace vacuum, avoiding contamination of the furnace with the heater elelement.

DESCRIPTION OF THE FIGURES

FIG. 2 is a detailed section view of the heater assembly of FIG. 1.

DESCRIPTION OF THE PREFERRED EMBODIMENT

Figure 1:
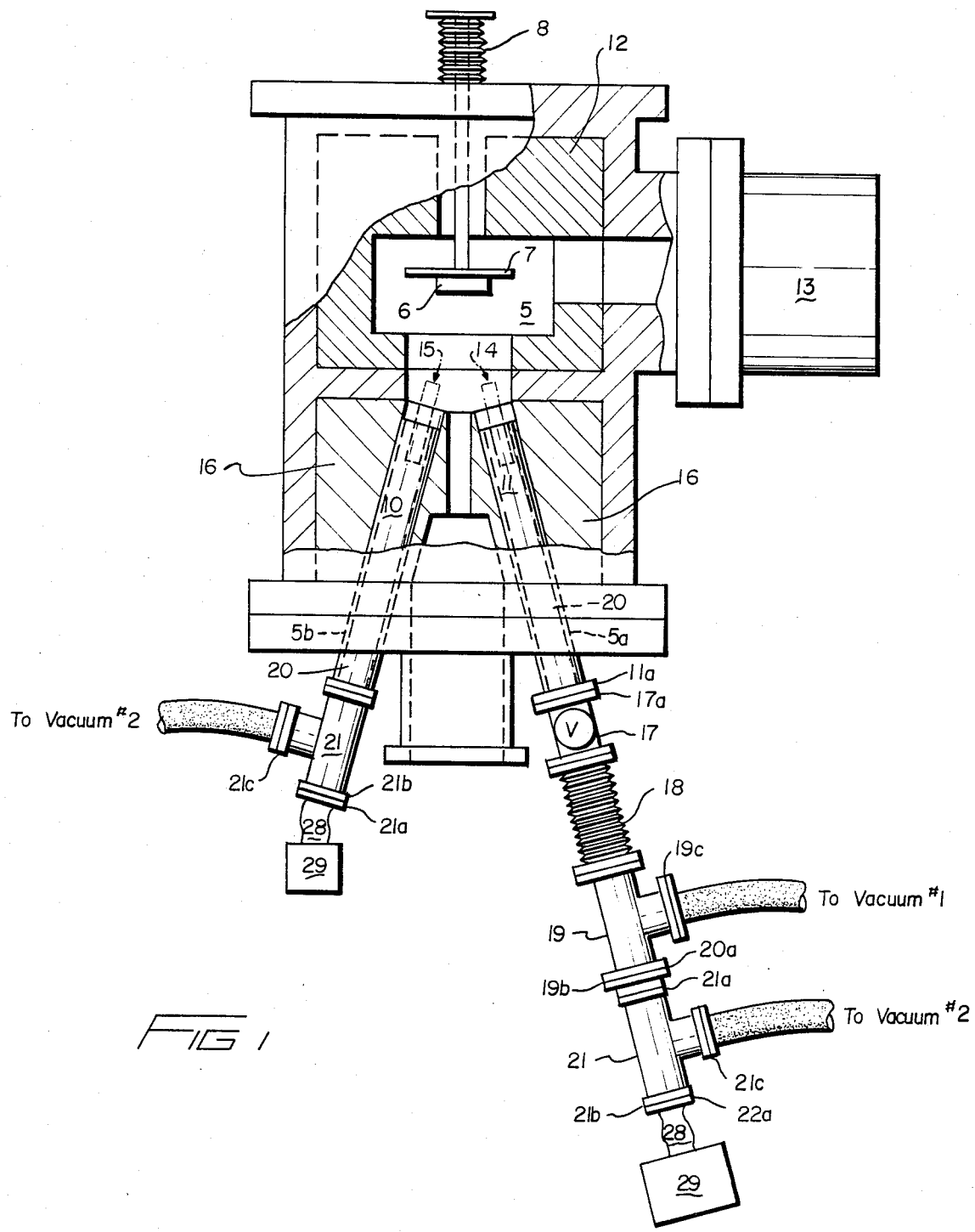
FIG. 1 is a section view of an MBE furnace utilizing the heater assembly of a preferred embodiment of the invention.

Referring now to FIG. 1, there is shown an MBE furnace utilizing the heater assembly of a peferred embodiment of the invention. A high vacuum chamber 5 is shown which contains a substrate 6 in position for receiving effused material. The substrate support 7 is connected to a manual control 8 which positions support 7 with respect to first and second effusion cells 10, 11. A cold shroud 12 is provided on both sides of the substrate support 7. A main vacuum pump 13 is provided to maintain a high vacuum of $10^{-10}$ torr or less within the furnace.

Effusion cells 10, 11 receive a crucible heating assembly 20 and crucible 14, 15 containing materials for forming epitaxial layers on substrate 6. The effusion cells 10, 11 are surrounded by a cold shroud 16 within the furnace vaccum chamber 5. Normally, the effusion cells 10, 11 would be terminated by an orifice and shutter to control the effusion of semiconductor atoms from the effusion cells, but for clarity these have been omitted from the Figure. The remaining ends of the effusion cells 10, 11 exit vacuum chamber 5 through apertures 5a, 5b.

Effusion cell 11 is terminated with a flange 11a connected to a flange 17a of vacuum valve 17. A bellows 18 is connected to the vacuum valve 17. Terminating the bellows 18 is a T coupling 19. The heater assembly 20 of the effusion cell 11 includes a terminating flange 20a which includes a mounting hole pattern to line up with a mounting hole pattern on a corresponding flange 19b of T coupling 19.

A second T coupling 21 is connected via a first flange 21a to the flange 20a of the heater assembly 20. A second flange 21b opposite said first flange 20a receives a heating element 22 having a flange 22a. A vacuum is applied to a third flange 21c to supply the requisite vacuum to heater assembly 20, separate and apart from the high vacuum applied at T coupling 19 through flange 19c.

The heater assembly 20 is more clearly shown in FIG. 2. T coupling 19 is shown having a flange 19b with mounting holes 19d aligned with mounting holes 20d of flange 20a. The heater assembly 20 includes a cylindrical housing 23 which is preferably a high purity Ta tube having at one end thereof a crucible receiving chamber 14a. The crucible receiving chamber 14a is also a high purity Ta tube and is welded vacuum tight with an end wall 14b and a sealing ring 14c at the end of the heater assembly housing 23. The end wall 14b and sealing ring 14c are also of a high purity Ta material. An electrical heating element 22 is coaxial with the crucible receiving chamber 14a and interior to heater assembly housing 23. The heating element 22 is supported on a flange 22a.

The heater assembly housing 23 is terminated at the opposite end by a flange 20a. Flange 20a is also seam welded along joint 20d to form a sealed joint with heater assembly housing 23. Flange 20a includes a plurality of mounting holes 20f. When the heater assembly housing 23 is inserted through T coupling 19, bellows 18 and valve 17, the crucible receiving chamber 14a is positioned in effusion cell 11. Mounting holes 20f of flange 20a are aligned with mounting holes 19d to receive appropriate fasteners.

Flange 20a includes a second smaller diameter flange 20b which includes tapped holes 20c. Holes 20c receive fastener 24 which fastens flange 21a of T coupling 21 through holes 21d to the smaller flange 20b. An appropriate seal 27 makes the flange joint vacuum tight. Flanges 20a and 20b include a central bore 20e which forms a passage for the heater element 22. The bore 20e provides a continuous vacuum chamber between flange 21c and the heated element compartment formed by crucible receiving chamber 14a and heater assembly housing 23.

The heating element 22 is supported by an insulating flange 22a to flange 21b by appropriate fasteners 25. Connections to an external power source 29 are made through cable 28 to provide a heat generating current to heating element 22 in the vicinity of crucible receiving chamber 14a.

With the structure of FIG. 2, a separate vacuum may be applied to the interior of heater assembly housing 23 through a T-coupling 21 flange 21c. A crucible located in crucible chamber 14a is heated by heater element 22, but shielded from any effluents dissipated by heater element 22. Heating element 22 may be replaced by removing fasteners 25 and flange 22a. The vacuum to the effusion cell 11 is maintained by a vacuum source connected to flange 19c of T coupling 19. The entire heater assembly 20 can be removed by extending bellows 18 until the end of heater assembly housing 23 clears the valve 17. Valve 17 will seal off the effusion cell 11 from losing its vacuum. Once extended, flanges 20a and 19c are separated, permitting the entire heater assembly 20 to be removed. The heater assembly 20 may be reinserted through T coupling 19 with the bellows 18 in the extended position. The end of the heater assembly 20 is inserted through valve 17 with the crucible 15 in the crucible chamber 14 while maintaining a vacuum on flange 19c of T coupling 19.

Effusion cell 10 also contains a heater assembly 20. Effusion cell 10 is terminated with T coupling 21 without the benefit of a sealing valve 17, bellows 18 or first T coupling 19. This cell 10 relies exclusively on the vacuum provided by vacuum chamber 5. The heater element 22 is maintained under a separate vacuum through flange 21c of coupling 21. The heater element 22 may be replaced by removing flange 22a from coupling 21 as in the case of the effusion cell 11. The heater assembly 20, however, may not be removed without losing the vacuum in chamber 5.

Thus, there is described a type of heater assembly for an MBE furnace which maintains the interior of the furnace free from effluent contaminants emitted from the heating element. The assembly permits a separate vacuum to be applied to the heater element isolated from the furnace interior vacuum. Those skilled in the art will recognize other embodiments described more particularly by the claims which follow.

What is claimed is:

1. In a molecular beam epitaxy furnace, a heater for heating the interior of an effusion cell comprising:
   an outer cylindrical sleeve having one end connected to receive a vacuum and an opposite end;
   an inner sleeve coaxial with said outer cylindrical sleeve, having one end sealed with said outer cylindrical sleeve opposite end, and extending along a portion of said cylindrical sleeve to a closed opposite end, said inner sleeve, and outer cylindrical sleeve providing an interior vacuum chamber; and,
   a heating element disposed between said cylindrical sleeve and inner sleeve for heating said interior vacuum chamber and a crucible located in said inner sleeve, whereby semiconductor constituent materials in said crucible are evaporated in an environment free from contaminants produced by said heating element.

2. A molecular beam epitaxy furnace apparatus for heating a crucible containing semiconductor material comprising:
   a vacuum housing;
   at least one effusion cell open at one end in said vacuum housing and extending through said vacuum housing;
   a heater assembly disposed in said effusion cell, including:
   an outer cylindrical housing;
   an inner cylindrical crucible housing coaxial with said outer cylindrical housing, and having one end thereof coplanar with one end of said cylindrical housing, the remaining end of said inner crucible housing being sealed with a wall member, and said coplanar ends being sealed with each other, said outer cylindrical housing and inner cylindrical housing forming a heater element chamber sealed from the interior of said inner cylindrical crucible housing;
   a flange terminating the remaining end of said outer cylindrical housing, said flange having means for coupling with an end of said effusion cell exterior to said vacuum housing and an opening to receive a vacuum; and
   a heating element disposed between said inner cylindrical crucible housing and said outer cylindrical housing, isolated from a crucible received in said inner cylindrical crucible housing to avoid contaminating said crucible and subject to a vacuum applied to said flange opening.

3. The molecular beam epitaxy furnace of claim 2 comprising:

a first vacuum pump connected to said effusion cell for applying a vacuum to the interior of said effusion cell; and a second vacuum pump connected to said outer cylindrical housing through said opening in said flange whereby a separate vacuum for said heater is provided.

4. The molecular beam epitaxy furnace of claim 2 further comprising:

a vacuum isolation valve connected to said effusion cell external to said housing;

a bellows connected to said vacuum isolation valve; and a T assembly having one side connected to said bellows, a second end opposite said one end for connection with said flange, and a third end connected to recieve said vacuum.

* * * * *